(12) United States Patent
Jang et al.

(10) Patent No.: US 11,791,846 B2
(45) Date of Patent: Oct. 17, 2023

(54) DECODER PERFORMING ITERATIVE DECODING, AND STORAGE DEVICE USING THE SAME

(71) Applicant: SAMSUNG ELECTRONICS CO., LTD., Suwon-si (KR)

(72) Inventors: Jae Hun Jang, Hwaseong-si (KR); Dong-Min Shin, Seoul (KR); Heon Hwa Cheong, Seongnam-si (KR); Jun Jin Kong, Yongin-si (KR); Hong Rak Son, Anyang-si (KR); Se Jin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 17/314,768

(22) Filed: May 7, 2021

(65) Prior Publication Data

US 2021/0281280 A1 Sep. 9, 2021

Related U.S. Application Data

(63) Continuation of application No. 15/956,960, filed on Apr. 19, 2018, now Pat. No. 11,031,957.

(30) Foreign Application Priority Data

Oct. 26, 2017 (KR) .......................... 10-2017-0139976

(51) Int. Cl.
*H03M 13/37* (2006.01)
*H03M 13/03* (2006.01)
(Continued)

(52) U.S. Cl.
CPC ........... *H03M 13/37* (2013.01); *G06F 11/085* (2013.01); *G06F 11/1012* (2013.01); *G06F 13/1673* (2013.01); *H03M 13/03* (2013.01)

(58) Field of Classification Search
CPC .. H03M 13/37; H03M 13/03; H03M 13/3746; H03M 13/1105; H03M 13/2948;
(Continued)

(56) References Cited

U.S. PATENT DOCUMENTS 8,219,879 B2 7/2012 Wu et al.
8,429,486 B2 4/2013 Kamiya
(Continued)

FOREIGN PATENT DOCUMENTS

KR 10-1267322 B1 5/2013
KR 10-1482684 B1 1/2015

*Primary Examiner* — James C Kerveros
(74) *Attorney, Agent, or Firm* — Sughrue Mion, PLLC

(57) ABSTRACT

A decoder including a main memory, a flag memory and a decoding logic is provided. The flag memory is configured to store flag data and the decoding logic configured to perform an iteration. Further, the decoding logic is configured to: perform an $i^{th}$ operation using first data, wherein i is a natural number, flag-encode second data that is results obtained by performing the $i^{th}$ operation on the first data, store results obtained by performing the flag encoding on the second data in the flag memory as first flag data if the flag encoding succeeds, and store predetermined second flag data that is different from the first flag data of the second data in the flag memory if the flag encoding fails.

20 Claims, 16 Drawing Sheets

(51) Int. Cl.
*G06F 13/16* (2006.01)
*G06F 11/08* (2006.01)
*G06F 11/10* (2006.01)

(58) Field of Classification Search
CPC .............. H03M 13/6505; G06F 11/085; G06F 11/1012; G06F 13/1673; Y02D 10/00
USPC ........................................................ 714/758
See application file for complete search history.

(56) References Cited

U.S. PATENT DOCUMENTS

| | | |
|---|---|---|
| 8,667,376 B2 | 3/2014 | Kamiya |
| 8,677,225 B1 | 3/2014 | Weiner |
| 9,755,665 B1 | 9/2017 | Chilappagari et al. |
| 9,778,985 B1 * | 10/2017 | Kim ........................ G11C 16/10 |
| 2004/0032347 A1 | 2/2004 | Yamazaki |
| 2009/0158125 A1 | 6/2009 | Harada et al. |
| 2010/0037121 A1 | 2/2010 | Jin et al. |
| 2012/0185744 A1 | 7/2012 | Varnica et al. |
| 2013/0246877 A1 | 9/2013 | Zhang et al. |
| 2015/0227419 A1 * | 8/2015 | Sakaue ................... G11C 29/52 |
| | | 714/764 |
| 2017/0141877 A1 * | 5/2017 | Ikegaya ............ H03M 13/2948 |
| 2018/0269905 A1 * | 9/2018 | Bhatia ............... H03M 13/2963 |

\* cited by examiner

FIG. 3A

ESTIMATE ERROR

310 ORIGINAL DATA: | 0 | 0 | 1 | 1 | 1 | 0 | 1 | 0 | 1 | 0 | 0 | 1 | 0 | 1 | 0 | 1 |

↓ Syndrome aided code

320 FIRST DATA: | 0 | 0 | 0 | 1 | 0 | 0 | 0 | 0 | 0 | 0 | 0 | 0 | 0 | 0 | 0 | 0 |

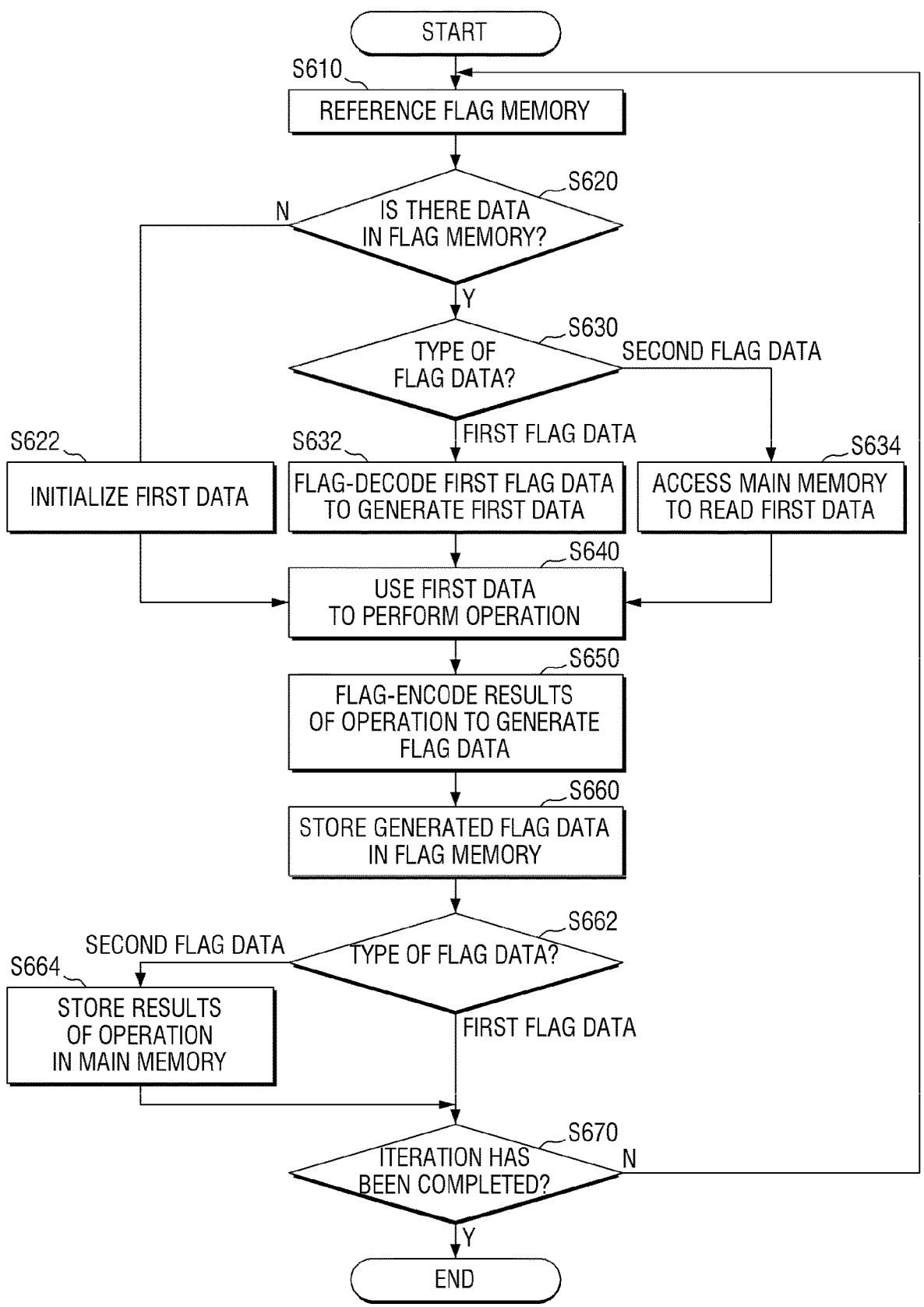

DECODER PERFORMING ITERATIVE DECODING, AND STORAGE DEVICE USING THE SAME

This application is a Continuation Application of U.S. patent application Ser. No. 15/956,960, filed on Apr. 19, 2018 in the U.S. Patent and Trademark Office, which is based on and claims priority under 35 U.S.C. § 119 to Korean Patent Application No. 10-2017-0139976, filed on Oct. 26, 2017, in the Korean Intellectual Property Office, the disclosures of which are incorporated by reference herein in their entireties.

BACKGROUND

1. Field

The disclosure relates to a decoder for performing iterative decoding, and a storage device using the same. More specifically, the disclosure relates to a decoder for performing iterative decoding that includes a first memory for storing intermediate values in iterations, and a second memory having a larger storage capacity than the first memory.

2. Description of the Related Art

Low-density parity-check (LDPC) decoding involves performing iterations, in which, the result values of each operation are stored in a memory as intermediate values, and the intermediate values are used to perform the next operation. For example, results of the $i^{th}$ operation process is stored in a memory as intermediate values, and the intermediate values are read by accessing that memory in the $(i+1)^{th}$ operation process, to perform the $(i+1)^{th}$ operation using the intermediate values.

In order to perform such processes, it is necessary to access the memory in each operation process, and therefore, a lot of power is consumed. In addition, if there is an error even in a single bit among the intermediate values stored in the memory, it may take a long time to correct the error, or there may be a failure to correct the error.

By simply reducing the number of accesses to the memory, the power consumption can be saved. However, it deteriorates the error correction. To reduce the number of accesses to the memory without deteriorating the error correction, the throughput is decreased.

SUMMARY

Aspects of the disclosure provide a decoder that performs iterative decoding with a low power consumption without compromising the throughput.

Aspects of the disclosure also provide a decoder that performs iterative decoding with a low power consumption and improved error correction.

According to an aspect of an embodiment, there is provided a decoder comprising: a main memory; a flag memory configured to store flag data; and decoding logic configured to perform an iteration comprising: performing an ith operation using first data to obtain second data, i being a natural number, performing a flag encoding operation on the second data, in response to the flag encoding operation being successful, storing in the flag memory a result obtained by the flag encoding operation performed on the second data as first flag data, and in response to the flag encoding operation being unsuccessful, storing a predetermined second flag data that is different from the first flag data of the second data in the flag memory.

A size of the first flag data may be smaller than a size of the first data and a size of the second data, and a size of the second flag data may be smaller than the size of the first data and the size of the second data.

A storage capacity of the flag memory may be smaller than a storage capacity of the main memory.

The decoding logic may be further configured to store the second data in the main memory in response to the flag encoding operation being unsuccessful.

The decoding logic may be further configured to: reference the flag data stored in the flag memory; when the referenced flag data is the first flag data, generate the second data by flag decoding the first flag data; when the referenced flag data is the second flag data, generate the second data by accessing and reading from the main memory; and perform an (i+1)th operation using the generated second data.

The decoding logic may be further configured to reference the flag data during buffer flushing.

The decoding logic may be further configured to transform data having random values into the first data using a syndrome-aided code.

The first flag data may indicate a location of a bit having a value of 1 in the first data.

The flag encoding operation may be performed by using a run-length code.

The main memory may be physically separated from the flag memory.

According to an aspect of an another embodiment, there is provided a decoder comprising: a main memory; a flag memory configured to store flag data; and decoding logic configured to perform an iteration comprising: referencing the flag data stored in the flag memory, and generating first data having a size larger than a size of the flag data based on the referenced flag data, and wherein the decoding logic is further configured to: generate the first data by performing a flag decoding operation on the first flag data in response to determining that the referenced flag data is first flag data, and generate the first data by accessing and reading the main memory in response to determining that the referenced flag data is predetermined second data different from the first flag data.

The decoding logic may be further configured to repeat the referencing the flag memory and the generating the first data for i number of times, wherein i is a natural number.

The decoding logic may be further configured to initialize and generate the first data when the referenced flag data is null.

The decoding logic may be further configured to reference the flag data during buffer flushing.

The main memory may be physically separated from the flag memory.

According to an aspect of an another embodiment, there is provided a storage device comprising: at least one non-volatile memory; and an Error Check and Correct (ECC) device connected to the at least one non-volatile memory, wherein the ECC device comprises: a first memory; a second memory having a storage capacity larger than the first memory; and decoding logic configured to perform ECC decoding using an iteration in response to reading data stored in the at least one non-volatile memory, wherein the ECC decoding comprises one of accessing only the first memory and accessing both the first and second memories depending on results of the iteration.

The ECC decoding may further comprises: performing an ECC flag encoding operation on results of an ith operation, i being a natural number; generating first flag data or second flag data based on a result of the ECC flag encoding operation; and storing the first flag data or the second flag data in the first memory.

The generating the first flag data or the second flag data may be based on whether the result of the ECC flag encoding operation is successful, wherein the result of the ECC flag encoding operation is generated as the first flag data in response to the ECC flag encoding operation being successful succeeds, and a predetermined second flag data different from the first flag data is generated in response to the ECC flag encoding operation being unsuccessful.

The storage device may comprise first and second ECC devices connected to first and second non-volatile memories, respectively, wherein the first and second ECC devices perform first and second ECC decoding, respectively, and wherein when the first ECC device completes the first ECC decoding, the first and second ECC devices perform the second ECC decoding together.

The ECC device may be further configured to transform the data stored in the at least one non-volatile memory into first data using a syndrome-aided code.

This and other aspects, embodiments and advantages of the present disclosure will become immediately apparent to those of ordinary skill in the art upon review of the Detailed Description and Claims to follow.

BRIEF DESCRIPTION OF THE DRAWINGS

The above and other aspects and features of the present disclosure will become more apparent by describing in detail certain embodiments thereof with reference to the attached drawings, in which:

FIG. 3A is a diagram illustrating an example of transformation of original data using a syndrome-aided code according to an embodiment.

FIG. 6 is a flowchart illustrating a process of an iteration according to an embodiment.

DETAILED DESCRIPTION OF THE EMBODIMENTS

Figure 1:
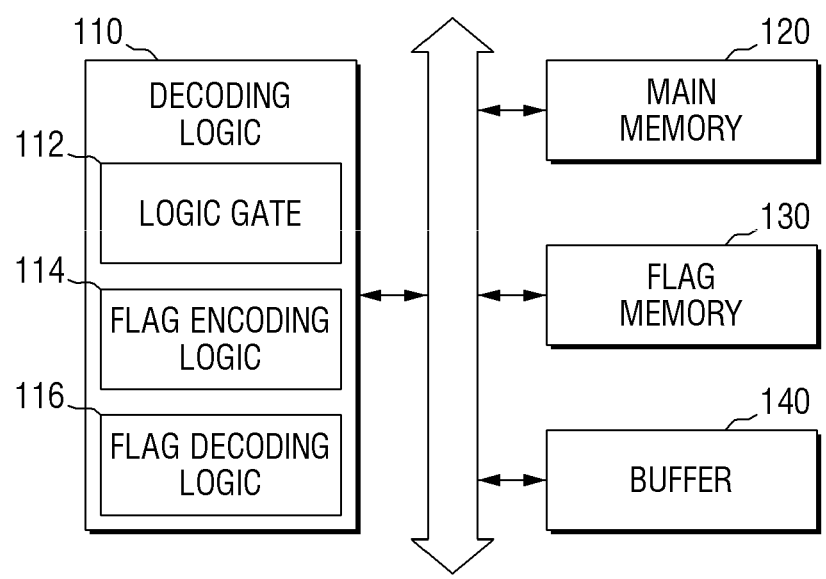
FIG. 1 is a block diagram of a decoder according to an embodiment.

FIG. 1 is a block diagram of a decoder according to an embodiment.

Referring to FIG. 1, a decoder 100 according to an embodiment may include decoding logic 110, a main memory 120, a flag memory 130, and a buffer 140. The decoder 100 may perform iterative decoding. For example, the decoder 100 may be a low-density parity-check (LDPC) decoder. It is, however, to be understood that embodiments of the present disclosure are not limited thereto. For example, the decoder 100 may be a turbo decoder.

The decoding logic 110 may include a logic gate 112, flag encoding logic 114, and flag decoding logic 116.

The logic gate 112 may actually perform operations using data. The flag encoding logic 114 may perform flag encoding to generate flag data, e.g., 01101, that is smaller than first data, e.g., 0001000000000000. The flag encoding logic 114 may perform operations using the logic gate 112 when it performs the flag encoding. The flag decoding logic 116 may perform flag decoding to restore the flag data back to the first data. The flag decoding logic 116 may perform operations using the logic gate 112 when it performs the flag decoding.

Although FIG. 1 illustrates the decoding logic 110 as including the flag encoding logic 114 and the flag decoding logic 116, embodiments of the present disclosure are not limited thereto. For example, the flag encoding logic 114 and the flag decoding logic 116 may be separated from the decoding logic 110. In addition, the flag encoding logic 114 and the flag decoding logic 116 may each include its own logic gate. The flag encoding logic 114 and the flag decoding logic 116 may perform flag encoding and flag decoding, respectively, using their respective logic gates.

The decoding logic 110 may process overall iterative decoding operations. For example, the decoding logic 110 may access the main memory 120 to read data. The decoding logic 110 may also write the read data to the buffer 140. In addition, the decoding logic 110 may perform operations using the data written into the buffer 140 and the logic gate 112. Further, the decoding logic 110 may access the flag memory 130 prior to accessing the main memory 120 and may determine the type of flag data to determine whether to access the main memory 120. A more detailed description thereon will be made later.

The decoding logic 110 may perform iterative decoding upon receiving a command issued from a host. Additionally, the decoding logic 110 may perform the iterative decoding given a particular situation. For example, the decoding logic 110 may perform the iterative decoding when the decoder 100 is provided with data having predetermined length. It is, however, to be understood that embodiments of the present disclosure are not limited thereto.

The terminology "decoding logic 110" used herein is not intended to limit the technical idea of the present disclosure. For example, the decoding logic 110 of FIG. 1 may be implemented as a central processing unit (CPU), a microprocessor (MPU), an application processor (AP), and/or a combination thereof.

The main memory 120 may store data therein. For example, the main memory 120 may store first data and second data. The main memory 120 may provide the buffer 140 with data necessary for the decoding logic 110 to perform operations. The main memory 120 may be a transitory computer-readable medium. For example, the main memory 120 may temporarily store data and may be read by a computer, such as a register, a cache, a static random access memory (SRAM), and a dynamic random access memory (DRAM). It is, however, to be understood that embodiments of the present disclosure are not limited thereto. For example, the main memory 120 may be a medium that semi-permanently stores data, such as a flash memory, a CD, a DVD, a hard disk, a blu-ray disk, a USB, and a ROM.

The flag memory 130 may store data therein. For example, the flag memory 130 may store first flag data and flag second data. The first flag data and the second flag data may be smaller in size than the first data and the second data, respectively. Therefore, the storage capacity of the flag memory 130 may be smaller than the storage capacity of the main memory 120. As a result, the power consumption for accessing the flag memory 130 may be smaller than the power consumption for accessing the main memory 120.

The flag memory 130 may be a different memory physically separated from the main memory 120. The flag memory 130 may be a transitory computer-readable medium. For example, the flag memory 130 may temporarily store data and may be read by a machine, such as a register, a cache, a static random access memory (SRAM), and a dynamic random access memory (DRAM). It is, however, to be understood that embodiments of the present disclosure are not limited thereto. For example, the flag memory 130 may be a medium that semi-permanently store data, such as a flash memory, a CD, a DVD, a hard disk, a blu-ray disk, a USB, and a ROM.

The buffer 140 may be a space for storing data temporarily for the decoding logic 110 to perform operations. Although the buffer 140 is shown in FIG. 1 as being separated from the decoding logic 110, embodiments of the present disclosure are not limited thereto. For example, in certain embodiments, the buffer 140 may be incorporated into the decoding logic 110. That is, the buffer 140 may be an internal buffer memory of the decoding logic 110. The buffer 140 may be a transitory computer-readable medium. The transitory computer-readable medium may temporarily store data and may be read by a machine, such as a register, a cache, a static random access memory (SRAM), and a dynamic random access memory (DRAM). It is, however, to be understood that example embodiments of the present disclosure are not limited thereto.

Figure 2:
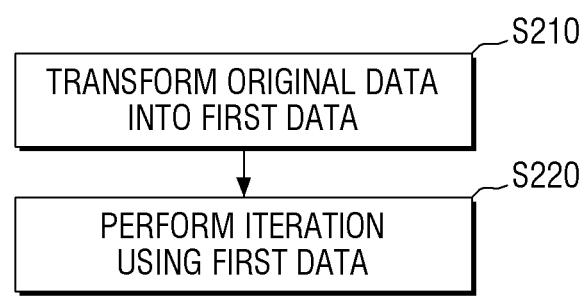
FIG. 2 is a flowchart illustrating a process performed before iterative decoding according to an embodiment.

FIG. 2 is a flowchart for illustrating a process performed before iterative decoding according to an embodiment.

Referring to FIG. 2, initially, original data is transformed into first data (step S210). The transformation of the original data into the first data may include transforming the original data having random values into first data having simple values. For example, the simple values of data may refer values containing an absolute majority of 1s or 0s. For example, 000000010000000 may be simple values.

In some embodiments, a syndrome-aided code may be used to transform the original data into the first data. The syndrome-aided code may represent a location of the original data where an error is likely to occur with 1. More detailed description thereon will be made with reference to FIGS. 3A and 3B.

FIG. 3A is a diagram illustrating an example of transformation of original data using a syndrome-aided code according to an embodiment.

Figure 3B:
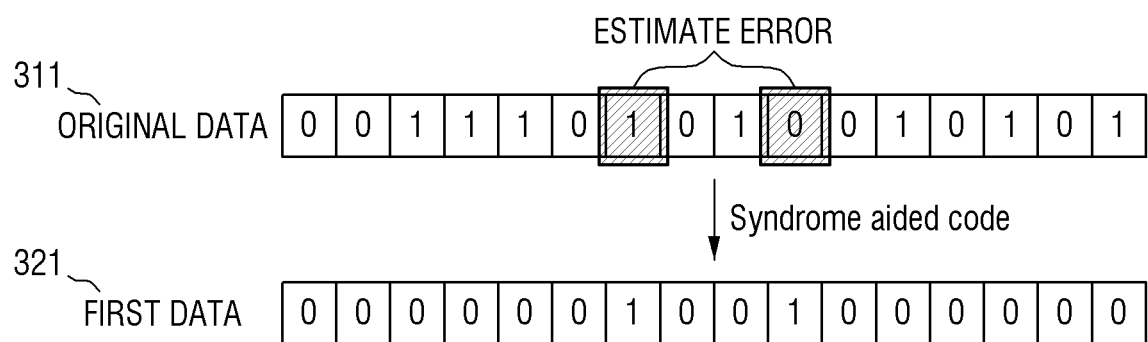
FIG. 3B is a diagram illustrating another example of transformation of original data using a syndrome-aided code according to an embodiment.

FIG. 3B is a diagram illustrating another example of transformation of original data using a syndrome-aided code according to an embodiment.

Referring to FIG. 3A, the original data 310 may be 0011101010010101. If it is estimated that there is an error in the value of the thirteenth bit from the rightmost bit, it may be expressed using the syndrome-aided code as 0001000000000000. In other words, when the original data 310 is transformed into the first data 320 using the syndrome-aided code, the first data 320 may have the values of 0001000000000000.

Referring to FIG. 3B, the original data 311 may be 0011101010010101. If it is estimated that there are errors in the values of the seventh bit and tenth bit from the rightmost bit, it may be expressed using the syndrome-aided code as 0000001001000000. In other words, when the original data 311 is transformed into the first data 321 using the syndrome-aided code, the first data 321 may have the values of 0000001001000000. It is to be noted that the above values described in the examples shown in FIGS. 3A and 3B are merely illustrative for convenience of illustration and are not intended to limit the scope of the present disclosure.

Although the decoding logic 110 may transform the original data 310 and 311 into the first data 320 and 321, respectively, in the examples shown in FIGS. 3A and 3B, embodiments of the present disclosure are not limited thereto. For example, in certain embodiments, a processor that is external to the decoder 100 may transform the original data 310 and 311 into the first data 320 and 321, respectively.

Although the syndrome-aided code is used in transforming the original data 310 and 311 having random values into the first data 320 and 321 having simple values in the foregoing description, embodiments of the present disclosure are not limited thereto. Any of well-known techniques to simplify certain data may be employed in transforming the original data 310 and 311 into the first data 320 and 321.

The transformation of the original data 310 and 311 into the first data 320 and 321, respectively, is performed in an embodiment to achieve lossless flag encoding and flag decoding, which will be described in detail later. Therefore, if original data has a simple value, the original data may be designated as first data, without performing the process of transforming the original data into the first data. In other words, the first data herein may be data having an absolute majority of 1s or 0s, with or without an intermediate process.

Referring again to FIG. 2, an iteration may be performed using the first data (step S220). Prior to describing the process of performing the iterations, the flag encoding and the flag decoding according to certain embodiments of the present disclosure will be described referring to FIGS. 4A, 4B and 5.

Figure 4A:
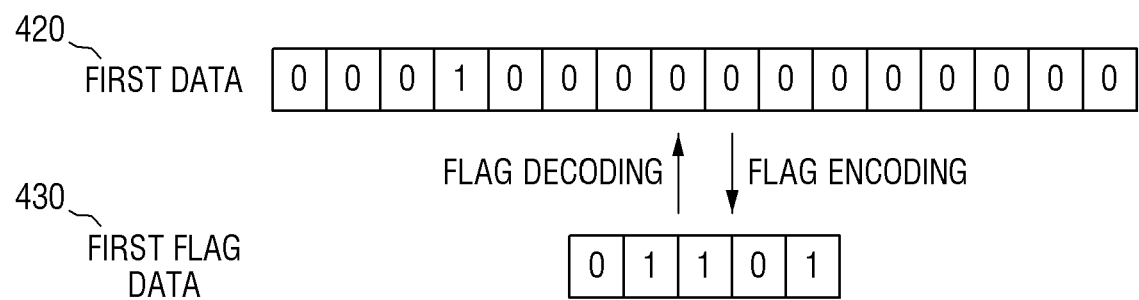
FIG. 4A is a diagram illustrating flag encoding and flag decoding according to an embodiment.

FIG. 4A is a diagram illustrating flag encoding and flag decoding according to an embodiment.

Referring to FIG. 4A, the decoding logic 110 according to an embodiment may flag-encode first data 420 to generate first flag data 430. For example, the first flag data 430 may indicate the location of the value of 1 in the first data 420. For example, when the first data 420 is 0001000000000000, the first flag data 430 generated by the flag encoding may be 01101. In other words, the first data 420 has the value of 1 at its thirteenth bit from the rightmost bit, and the first flag data 430 generated by the flag encoding may be 01101, which represents 13.

The flag decoding may be performed by reversing the process of performing the flag encoding described above. Accordingly, the process of flag decoding is not described for convenience of illustration.

The first data 420 of FIG. 4A may be transformed using the syndrome-aided code in FIG. 3A, but embodiments of the present disclosure are not limited thereto.

Figure 4B:
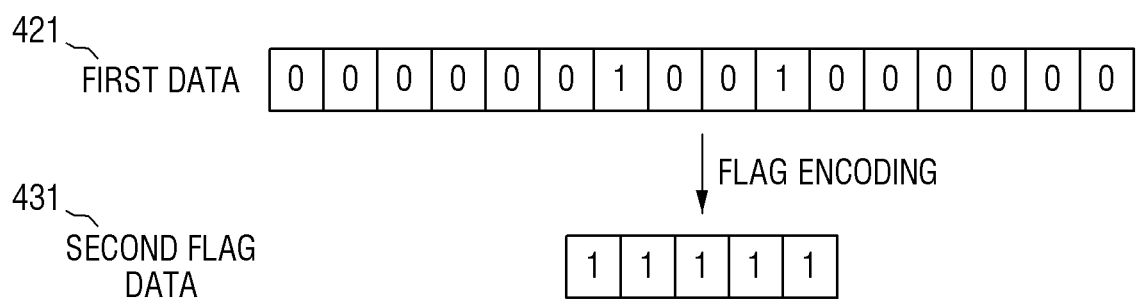
FIG. 4B is a diagram illustrating an example of failure of flag encoding according to an embodiment.

FIG. 4B is a diagram for illustrating an example of failure of flag encoding according to some example embodiments of the present disclosure.

Referring to FIG. 4B, according to an embodiment, first data 421 may be flag-encoded to generate second flag data 431. For example, the second flag data 431 may represent the failure of the flag encoding of the first data 421 and may be a predetermined value different from the first flag data. For example, if the first data 421 includes two or more 1s when the first data 421 is flag-encoded, it may not be possible to effectively indicate the locations of the 1s. In other words, if the first data 421 includes two or more 1s, the flag encoding may fail. If the flag encoding fails, the second flag data 431 may be generated with a predetermined value that is different from the first flag data and indicates the failure of the flag encoding. For example, the second flag data 431 may be 11111.

When the flag data is the second flag data 431, flag decoding cannot be performed. For example, when the first data 421 is 0000001001000000, the values of 11111 may be generated by flag encoding in either case. Therefore, when the second flag data 431 is 11111, it cannot be restored to the first data 421. Therefore, in certain embodiments, if the flag data is the second flag data 431, flag decoding may not be performed.

The first data 421 of FIG. 4B may be transformed using the syndrome-aided code in FIG. 3B, but embodiments of the present disclosure are not limited thereto.

Referring to FIGS. 1, 4A and 4B, when the first data 420 and first data 421 are compared with the first flag data 430 and the second flag data 431, respectively, if the first data 420 and the first data 421 have the size of $2^N$ bits, the first flag data 430 and the second flag data 431 may have the size of N+1 bits. For example, if the first data 420 and the first data 421 have the size of $2^{10}$ bits, the first flag data 430 and the second flag data 431 may have the size of 11 bits. Accordingly, the first flag data 430 and the second flag data 431 may be much smaller than the first data 420 and the first data 421. Accordingly, as described above, the storage capacity of the main memory 120 storing the first data 420 and the first data 421 may be larger than the storage capacity of the flag memory 130 storing the first flag data 430 and the second flag data 431.

Figure 5:
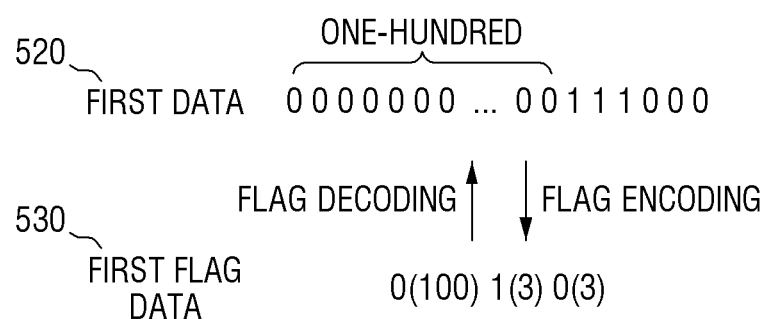
FIG. 5 is a diagram illustrating flag encoding and flag decoding according to an embodiment.

FIG. 5 is a diagram for illustrating flag encoding and flag decoding according to an embodiment.

Referring to FIG. 5, according to an embodiment, first data 520 may be flag-encoded to generate first flag data 530. For example, flag encoding and flag decoding may use run-length codes. For example, let us assume that the first data 520 is 0000000 . . . 00111000. In addition, let us assume that the number of consecutive 0s from the leftmost bits is 100. In this example, the first flag data 530 generated by flag encoding may be 0(100)1(3)0(3). Each of the numbers in the respective parentheses indicates the number of consecutive numbers before the parentheses. That is, the run-length code may indicate the length of each of the runs (sequences in which the same data value occurs). In some embodiments, with the run-length code, the larger the number of runs, the smaller the size of the first flag data 530 may be. For example, assuming that the first data 520 includes M consecutive data 1s and N consecutive 0s, the size of the first data 520 may be M+N. If the first data 520 is flag-encoded using the run-length code, the size of the first flag data 530 may be 1+$\log_2$ M+1+$\log_2$ N. The size of each of the 1s is used to indicate the value of consecutive data (e.g., 1 or 0). The $\log_2$ M and $\log_2$ N is used to indicate the numbers of consecutive data values (e.g., M consecutive data values, N consecutive data values), respectively. That is, the first flag data 530 may be 1(M)0(N).

The flag decoding may be performed by reversing the process of performing the flag encoding described above. Accordingly, the process of flag decoding is not described for convenience of illustration.

In FIGS. 4A, 4B and 5, the flag encoding and the flag decoding according to an embodiment have been described. It is, however, to be understood that this is merely illustrative. Those skilled in the art would be able to select and apply appropriate flag encoding and flag decoding schemes depending on the type, the form and the number of errors of the first data. For example, Huffman code or Lempel-Ziv-Welch code may be used to perform the flag encoding and the flag decoding according to an embodiment.

FIG. 6 is a flowchart illustrating a process of an iteration according to an embodiment.

FIGS. 7A, 7B, 8A and 8B are diagrams illustrating iteration processes according to an embodiment.

The flowchart of FIG. 6 will be described in conjunction with FIGS. 7A, 7B, 8A and 8B to facilitate the illustration.

In FIGS. 7A, 7B, 8A and 8B, the decoding logic 110, the main memory 120, the flag memory 130 and the buffer 140 may be same as in FIG. 1. Referring to FIG. 6, initially, when the iteration process is started, the flag memory 130 is first referenced to (step S610).

It is determined whether there is flag data in the flag memory 130 (step S620). If it is determined that there is no data in the flag memory 130 (No in step S620), the first data is initialized to generate the first data (step S622). Initializing the first data may be a process of transforming the original data of FIGS. 3A and 3B into the first data.

Figure 7A:
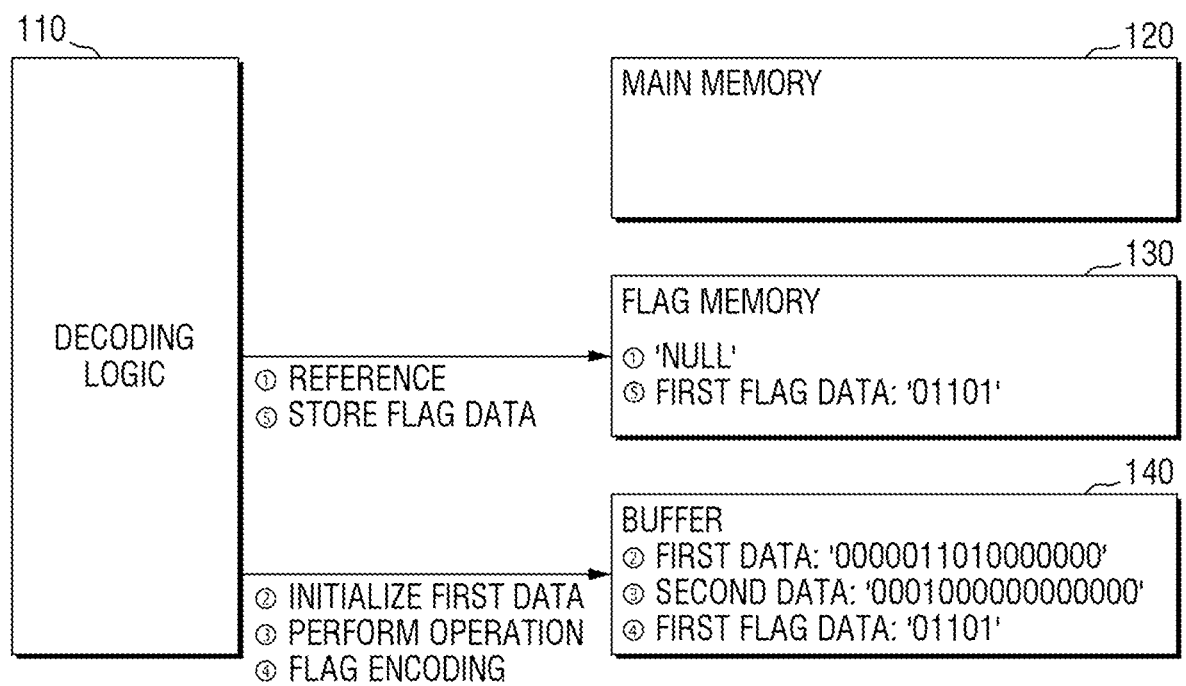
FIGS. 7A, 7B, 8A and 8B are diagrams illustrating iteration processes according to an embodiment.
Figure 7B:
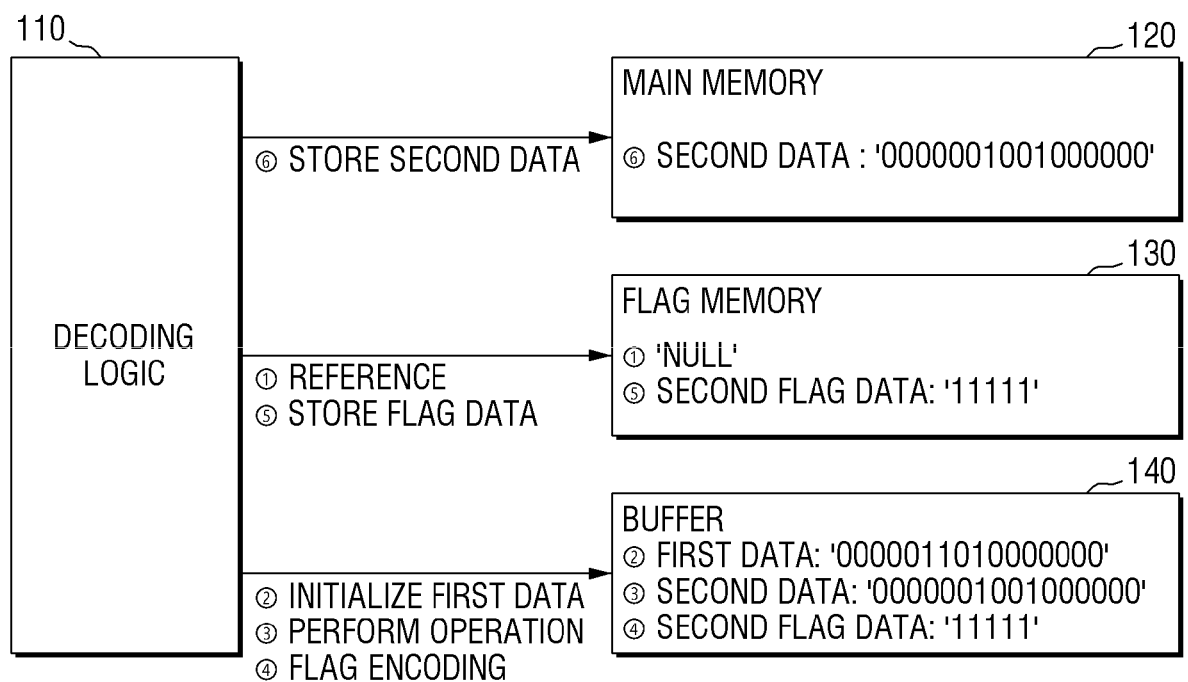

Referring to FIGS. 7A and 7B, the decoding logic 110 may reference the flag memory 130. If there is no flag data in the flag memory 130, that is, if the flag memory 130 is NULL, the decoding logic 110 may initialize the first data and store it in the buffer 140. For example, let us assume that the initialized first data is 0000011010000000 (①, ②).

Referring again to FIG. 6, an operation is performed using the generated first data (step S640). As used herein, the results of the operation of the first data are referenced to as second data for convenience of illustration.

Referring to FIG. 7A, the decoding logic 110 may perform an operation using the first data stored in the buffer 140. The results of the operation of the first data may be stored in the buffer 140 as the second data. For example, it is assumed that the results of the operation by the decoding logic 110 using the first data 0000011010000000 is the second data, that is, 0001000000000000 (③ in FIG. 7A).

Referring to FIG. 7B, the decoding logic 110 may perform an operation using the first data stored in the buffer 140. The results of the operation of the first data may be stored in the buffer 140 as the second data. For example, it is assumed that the results of the operation by the decoding logic 110 using the first data 00000110100000000 is the second data, that is, 0000001001000000 (③ in FIG. 7B).

Referring again to FIG. 6, flag data is generated by flag-encoding the second data (step S650). The generated flag data is stored in the flag memory 130 (step S660).

Referring to FIG. 7A, the decoding logic 110 may generate the first flag data by flag-encoding the second data. The first flag data may be, for example, 01101 (④ in FIG. 7A).

The flag encoding used in FIG. 7A may be the flag encoding described above with reference to FIG. 4A. In other words, the first flag data may be generated to indicate the location of 1 in the second data. It is, however, to be understood that example embodiments of the present disclosure are not limited thereto.

The decoding logic 110 may store the first flag data in the flag memory 130. For example, the decoding logic 110 may store the first flag data of 01101 in the flag memory 130 (⑤ in FIG. 7A).

Referring to FIG. 7B, the decoding logic 110 may generate the second flag data by flag-encoding the second data. The second flag data may be, for example, 11111 (④ in FIG. 7B).

The flag encoding used in FIG. 7B may be the flag encoding described above with reference to FIG. 4B. In other words, the second flag data of 11111 may represent the failure of the flag encoding of the second data. It is, however, to be understood that example embodiments of the present disclosure are not limited thereto.

The decoding logic 110 may store the second flag data in the flag memory 130. For example, the decoding logic 110 may store the second flag data of 11111 in the flag memory 130 (⑤ in FIG. 7B).

Referring again to FIG. 6, the type of generated flag data is determined (step S662). If it is determined that the generated flag data is the first flag data, it is determined whether the iteration has been completed (step S670). If not (No in step S670), the flag memory 130 is referenced to again (step S610), and the above-described processes are repeated. If it is determined that the iteration has been completed (Yes in step S670), the process ends.

If it is determined that the generated flag data is the second flag data, the second data is stored in the main memory 120 (step S664).

Referring to FIG. 7B, the decoding logic 110 may store the second data in the main memory 120. For example, the decoding logic 110 may store the second data of 00000100100000 in the main memory 120 (⑥ in FIG. 7B).

Referring again to FIG. 6, it is determined whether the iteration has been completed (step S670). If it is determined that the iteration has not been completed (No in step S670), the flag memory is referenced to again (step S610), and the above-described processes are repeated. If it is determined that the iteration has been completed (Yes in step S670), the process ends.

It is determined whether there is flag data in the flag memory 130 (step S620). If it is determined that there is flag data in the flag memory 130 (Yes in step S620), the type of the flag data in the flag memory 130 is determined (step S630). If it is determined that the flag data in the flag memory 130 is the first flag data, the first flag data is flag-decoded to generate first data (step S632). Subsequently, an operation is performed using the generated first data (step S640). Subsequently, steps S650 to S670 may proceed in the same manner as described above.

Figure 8A:
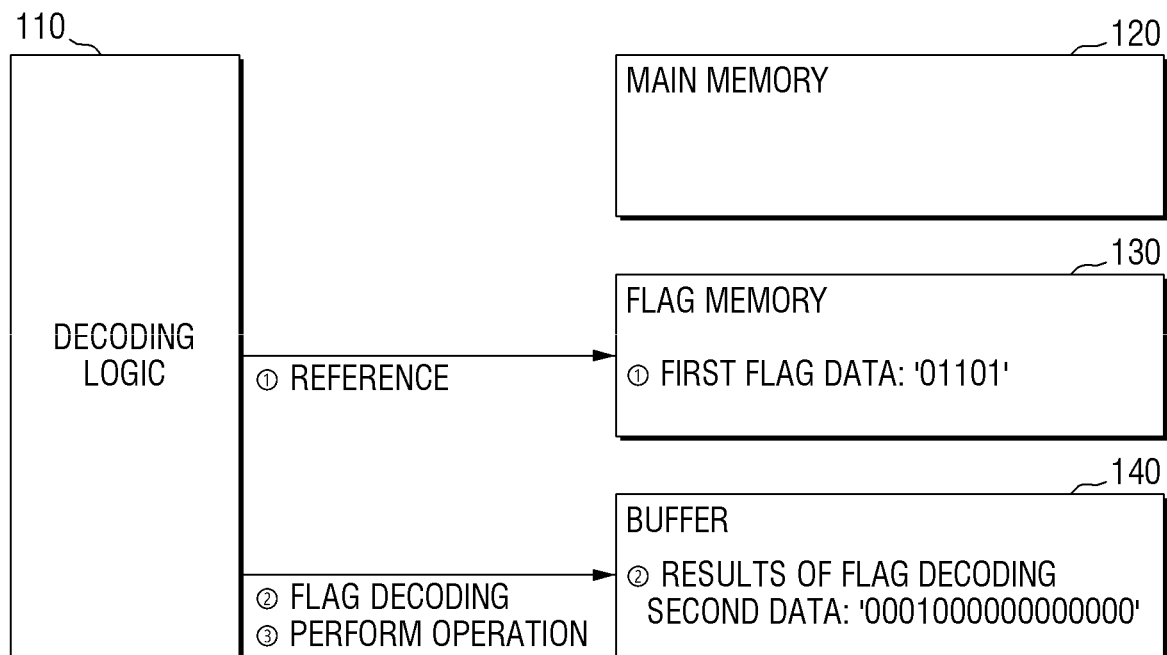

Referring to FIG. 8A, the decoding logic 110 may reference the flag memory 130 (①). If there is the first flag data in the flag memory 130, the decoding logic 110 may flag-decode the first flag data to restore the second data and may store it in the buffer 140. For example, if there is the first flag data of 01101 in the flag memory 130, the decoding logic 110 may flag-decode it to restore the second data of 0001000000000000 and may store it in the buffer 140 (②). The decoding logic 110 may perform an operation using the second data stored in the buffer 140 (③). The flag decoding used in FIG. 8A may be the flag decoding described above with reference to FIG. 4A. It is, however, to be understood that this is merely illustrative.

Referring again to FIG. 6, it is determined whether there is flag data in the flag memory 130 (step S620). If it is determined that the flag data in the flag memory 130 is the second flag data, the main memory 120 is accessed, to read the first data from the main memory 120 (step S634). Subsequently, an operation is performed using the read first data (step S640). Subsequently, steps S650 to S670 may proceed in the same manner as described above. Such procedure will be described in detail with reference to FIGS. 8A and 8B.

Figure 8B:
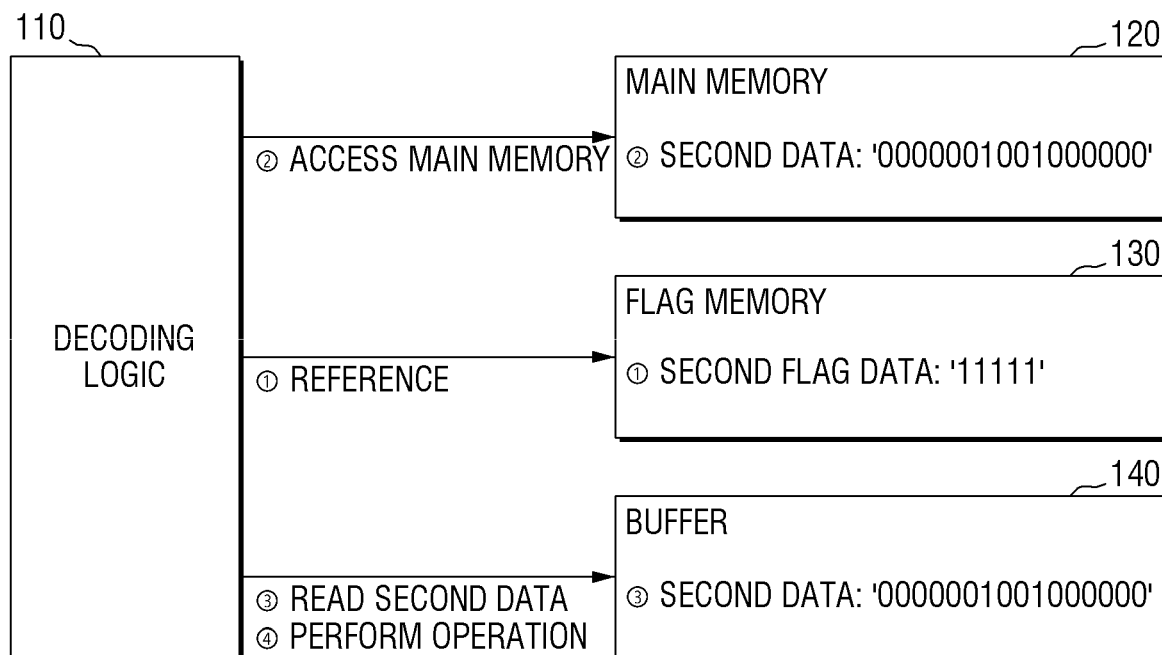

Referring to FIG. 8B, the decoding logic 110 may reference the flag memory 130 (①). If there is the second flag data in the flag memory 130, the decoding logic 110 may access the main memory 120. The decoding logic 110 may read the second data from the main memory 120 to store it in the buffer 140. For example, if there is the second flag data of 11111 in the flag memory 130, the decoding logic 110 may access the main memory 120. The decoding logic 110 may read the second data of 0001000000000000 from the main memory 120 to store it in the buffer 140 (②, ③). The decoding logic 110 may perform an operation using the second data stored in the buffer 140 (④).

Figure 9:
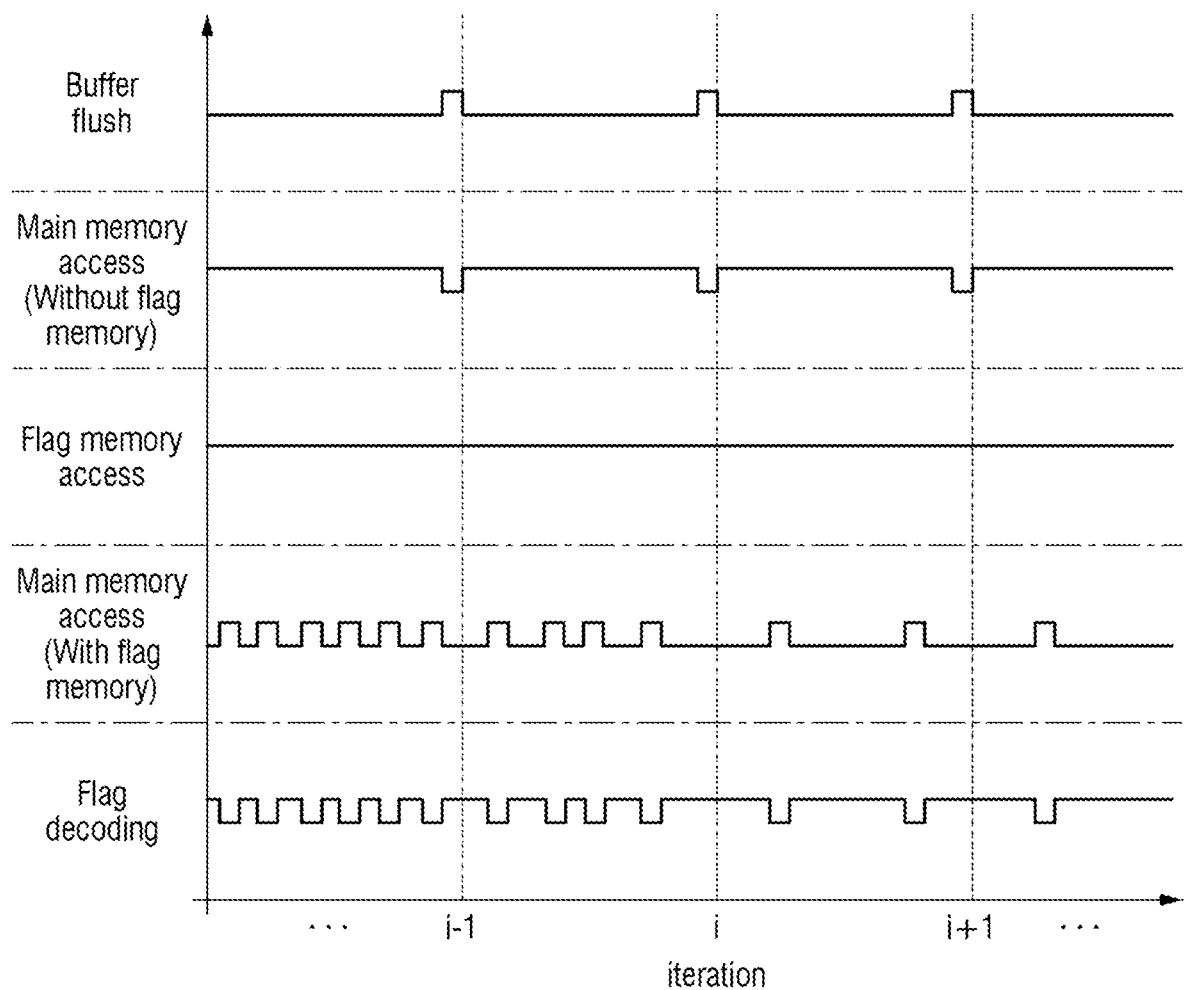
FIG. 9 is a timing diagram illustrating the operation of each of the elements in the process of performing the iteration according to an embodiment.

FIG. 9 is a timing diagram for illustrating the operation of each of the elements in the process of performing the iteration according to an embodiment.

Referring to FIG. 9, a buffer flush happens at the end of every iteration. According to an embodiment, the decoding logic 110 may perform operations using data stored in the buffer 140, and may store the results of the operations in the main memory 120 or generate first flag data by performing flag encoding on the results of the operations to store the first flag data in the flag memory 130. Subsequently, it is necessary to erase the data stored in the buffer 140 for subsequent operations, which is referenced to herein as a buffer flush.

The decoding logic 110 may reference the flag memory 130 while the buffer flush is happening. By doing so, the time required to reference the flag memory 130 can be saved. Thus, in certain embodiments, the decoding logic 110 does not allocate time to reference the flag memory 130 because it references the flag memory 130 during the buffer flush, and thus the overall throughput can be maintained.

If there is no flag memory 130, the main memory 120 may be accessed at any time except while the buffer flush is happening. That is, if there is no flag memory 130, the main memory 120 may not be accessed while the buffer flush is happening.

If there is the flag memory 130, the flag memory 130 may be accessed all the time.

If there is the flag memory 130, the main memory 120 may be accessed when data is read therefrom or written thereinto. In other words, the main memory 120 may be accessed only when there is the second flag data in the flag memory 130.

That is, when the first flag data is in the flag memory 130, only the flag memory 130 may be accessed. Further, when the second flag data is in the flag memory 130, both the main memory 120 and the flag memory 130 may be accessed. As the operation process is repeated over and over, the number of accesses to the main memory 120 may be reduced. It is, however, to be understood that this is merely illustrative.

The flag decoding may be performed only when the main memory 120 is not accessed. That is, the flag decoding may be performed only when the first flag data is in the flag memory 130.

Figure 10:
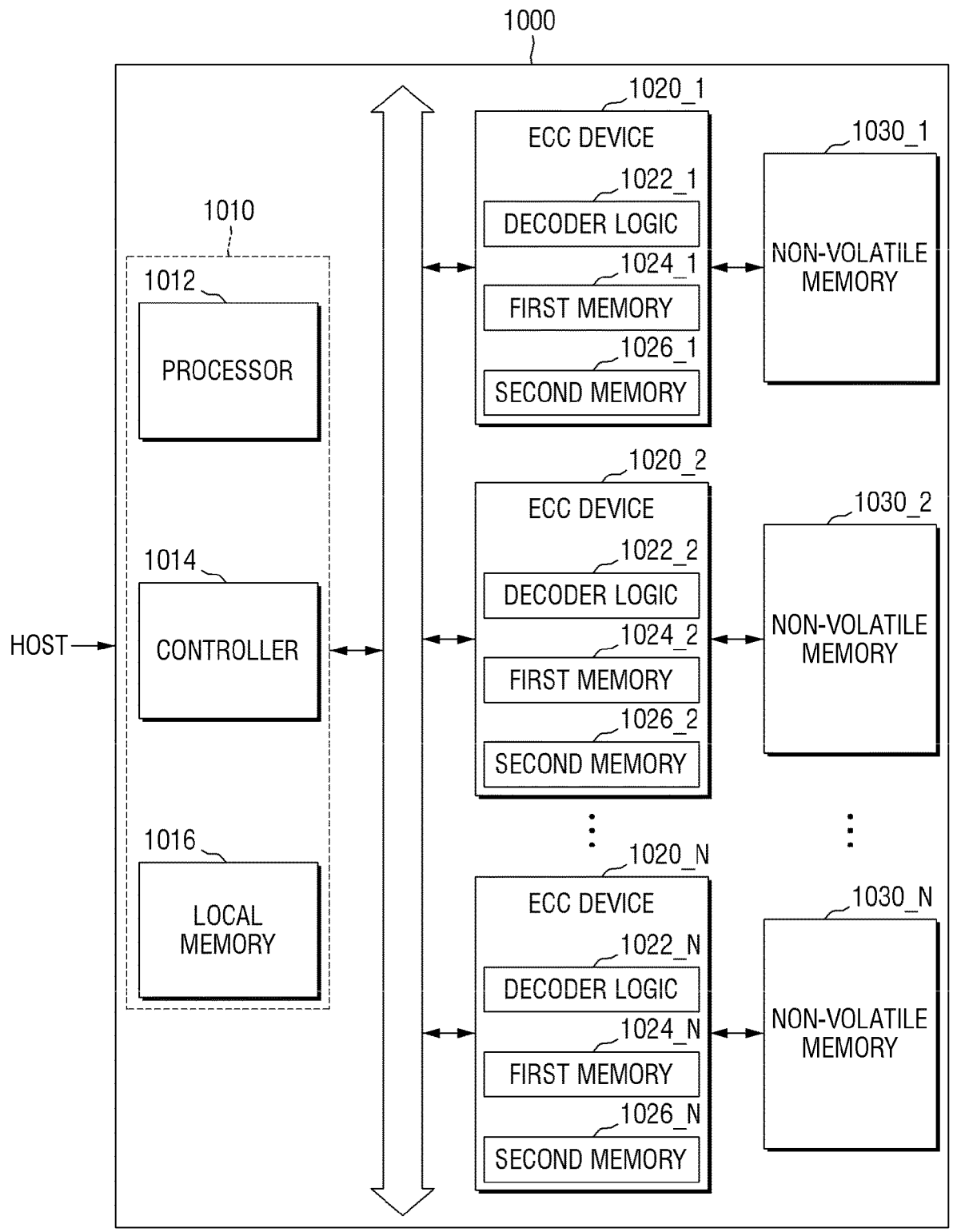
FIG. 10 is a block diagram of a storage device that performs error correction through iterations according to an embodiment.

FIG. 10 is a block diagram of a storage device that performs error correction through iterations according to an embodiment.

Referring to FIG. 10, a storage device 1000 according to an embodiment may include a non-volatile memory controller 1010, ECC devices 1020_1 to 1020_N, and non-volatile memories 1030_1 to 1030_N.

The non-volatile memory controller 1010 may include a processor 1012, a controller 1014, and a local memory 1016.

The processor 1012 may be implemented as circuitry, logic, code or a combination thereof, and may control the overall operation of the storage device 1000. When power is applied to the storage device 1000, the processor 1012 may run, on a RAM, firmware for operating the storage device 1000 stored in a ROM, to thereby control the overall operation of the storage device 1000.

The controller 1014 controls the local memory 1016 disposed in the storage device 1000. The local memory 1016 may include a ROM or a RAM. In certain embodiments, the ROM may store a firmware code for driving the storage device 1000. The RAM may store a variety of commands or variables input from a host HOST. In addition, the RAM may store data input to or output from the non-volatile memories 1030_1 to 1030_N. In addition, a variety of parameters and variables input to and output from the non-volatile memories 1030_1 to 1030_N may be stored.

As shown in FIG. 10, the ECC devices 1020_1 to 1020_N may include decoding logic 1022_1 to 1022_N, first memories 1024_1 to 1024_N, and second memories 1026_1 to 1026_N, respectively. The decoding logic 1022_1 to 1022_N, the first memories 1024_1 to 1024_N and the second memories 1026_1 to 1026_N may be the same as or similar to the decoding logic 110, the flag memory 130 and the main memory 120 of FIG. 1, respectively. In other words, the storage capacities of the first memories 1024_1 to 1024_N may be smaller than those of the second memories 1026_1 to 1026_N. In addition, the size of data stored in the first memories 1024_1 to 1024_N may be smaller than the size of data stored in the second memories 1026_1 to 1026_N. The ECC devices 1020_1 to 1020_N may perform error correction decoding (ECC decoding) using the iterations according to some example embodiments of the present disclosure. Although not shown in the drawing, each of the ECC devices may include the buffer 140 of FIG. 1.

The non-volatile memories 1030_1 to 1030_N may store data received from the non-volatile memory controller 1010 in memory cells. Specifically, the non-volatile memories 1030_1 to 1030_N may include a plurality of cell arrays for storing data. The cell arrays may include a plurality of planes. The planes may include a plurality of blocks. The blocks may include a plurality of pages. In some embodiments, the non-volatile memories 1030_1 to 1030_N may be non-volatile memories including an electrically erasable programmable read-only memory (EEPROM), a ferroelectrics random access memory (FRAM), a phase-change random access memory (PRAM), and a magnetic random access memory (MRAM).

Although the storage device 1000 shown in FIG. 10 includes the plurality of ECC devices 1020_1 to 1020_N and the plurality of non-volatile memories 1030_1 to 1030_N connected thereto, respectively, example embodiments of the present disclosure are not limited thereto. For example, a plurality of non-volatile memories 1030_1 to 1030_N may be connected to the single ECC device 1020_1. Also, for example, the storage device 1000 may include the single ECC device 1020_1 and the single non-volatile memory 1030_1. Thus, those skilled in the art would be able to implement the storage device in a variety of combinations.

In certain embodiments, when a data read command is input from a host HOST, the non-volatile memory controller 1010 may read data from the non-volatile memories 1030_1 to 1030_N. In doing so, the ECC devices 1020_1 to 1020_N may ECC decode the data stored in the non-volatile memories 1030_1 to 1030_N, respectively, using the iterations as described above with reference to FIGS. 1 to 9. For example, the ECC decoding may be LDPC decoding. Hereinafter, a method of driving the storage device according to an embodiment will be described with reference to FIG. 11.

Figure 11:
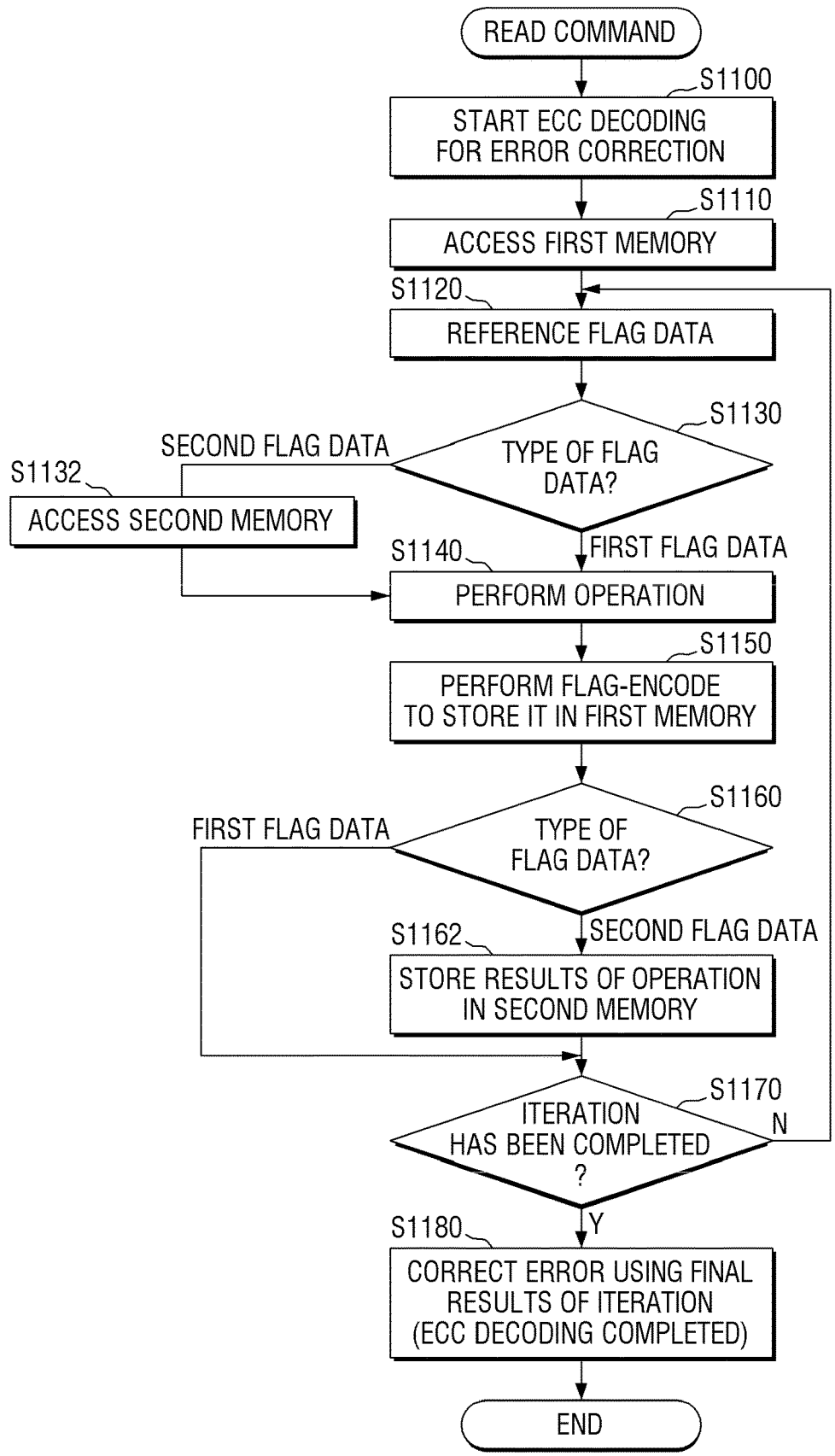
FIG. 11 is a flowchart illustrating a method of performing ECC decoding using iterations by the storage device according to an embodiment.

FIG. 11 is a flowchart illustrating a method of performing ECC decoding using iterations by the storage device according to an embodiment. For convenience of illustration, description will be made with reference to FIG. 10.

Referring to FIGS. 10 and 11, when a read command is input from the host HOST, error correction on the data stored in the non-volatile memories 1030_1 to 1030_N may be started. Alternatively, when a read command is input from the host HOST, the data stored in the non-volatile memories 1030_1 to 1030_N may be transmitted to the ECC devices 1020_1 to 1020_N, respectively, and each of the ECC devices 1020_1 to 1020_N may start error correction on the data when it receives the data of a predetermined length. Errors in the stored data may be corrected through ECC decoding using an iteration (step S1100). For convenience of illustration, it is assumed that the ECC decoding process is performed with the signal ECC device 1020_1 and the single non-volatile memory 1030_1. For the sake of convenience of illustration, the redundant description will be omitted or briefly described.

When the ECC decoding is started, the decoding logic 1022_1 first accesses the first memory 1024_1 (step S1110) and references the flag data (step S1120).

The type of the referenced flag data is determined (step S1130). If it is determined that the referenced flag data is the second flag data, the second memory 1026_1 is accessed (step S1132). After the access the second memory 1026_1, an operation is performed (step S1140). If it is determined that the referenced flag data is the first flag data, the operation is performed without accessing the second memory 1026_1 (step S1140). For example, if it is determined that the referenced flag data is the first flag data, the decoding logic 1022_1 may flag-decode the first flag data of the first memory 1024_1 to use it for the operation. For example, if the referenced flag data is the second flag data, the decoding logic 1022_1 may read the data stored in the second memory 1026_1 to use it for the operation.

The results of the operation are flag-encoded and stored in the first memory 1024_1 (step S1150).

The type of the flag data generated by flag-encoding the results of the operation is determined (step S1160).

If it is determined that the generated flag data is the second flag data, the second memory 1026_1 is accessed and the results of the operation are stored in the second memory 1026_1 (step S1162). Then, it is determined whether the iteration is completed (step S1170). If it is determined that the generated flag data is the first flag data, it is determined whether the iteration is completed (step S1170).

If it is determined that the iteration has been completed, that is, the ECC decoding has been completed, the error may be corrected using the final results of the iteration (step S1180).

In certain embodiments, the ECC decoding may be performed in parallel. Further, for example, when the non-volatile memory controller 1010 reads a plurality of data items from the plurality of non-volatile memories 1030_1 to 1030_N, respectively, each of the plurality of ECC devices 1020_1 to 1020_N may perform ECC decoding.

In certain embodiments, in performing the ECC decoding, one of the ECC devices that has completed the ECC decoding (e.g., the ECC device 1020_1) may together perform the operation of another ECC device that has not yet completed the ECC decoding (e.g., the ECC device 1020_2). For example, when a read command is executed, the first and second ECC devices 1020_1 and 1020_2 may decode the data stored in the first and second non-volatile memories 1030_1 and 1030_2, respectively. When the first ECC device 1020_1 completes the ECC decoding, the first ECC device 1020_1 may transmit a message indicative of the completion of the ECC decoding to the non-volatile memory controller 1010. When the non-volatile memory controller 1010 receives the message from the first ECC device 1020_1, the non-volatile memory controller 1010 may allow the first ECC device 1020_1 to join the operation process performed by the second ECC device 1020_2 that has not yet transmitted the message indicative of the completion of the ECC decoding.

Figure 12:
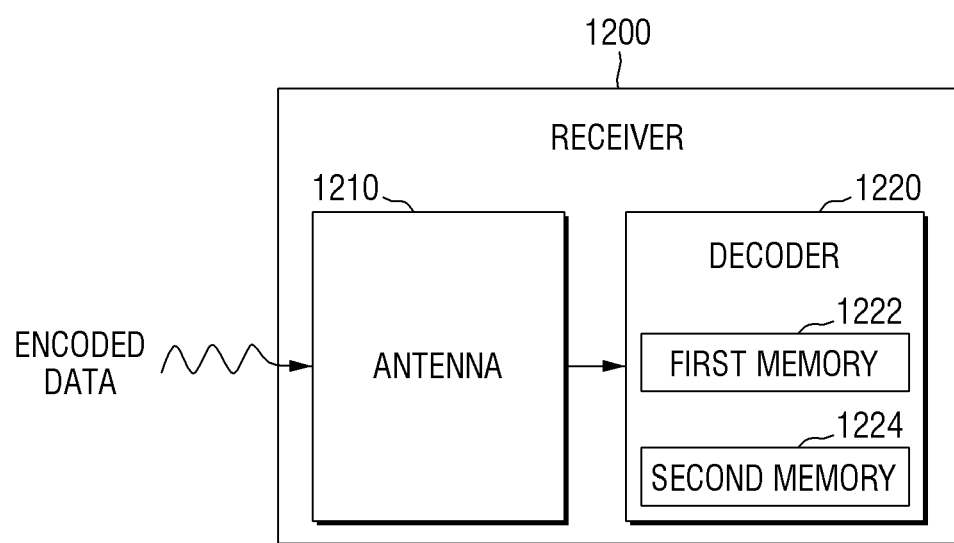
FIG. 12 is a block diagram illustrating the structure of a receiver according to an embodiment.

FIG. 12 is a block diagram illustrating the structure of a receiver according to an embodiment. Descriptions of the identical elements described above will be omitted or briefly described to avoid redundancy.

Referring to FIG. 12, a receiver 1200 according to an embodiment may include an antenna 1210 and a decoder 1220. The decoder 1220 of FIG. 12 may be identical to the decoder 100 of FIGS. 1 to 9.

The antenna 1210 may receive the encoded data. For example, the encoded data may be LDPC-encoded data. The encoded data received by the antenna 1210 may be transmitted to the decoder 1220. The decoder 1220 may decode the encoded data using iterative decoding. For example, when encoded data is transmitted from the antenna 1210, the decoder 1220 may transform the encoded data into first data having a simple value. The decoder 1220 may decode the first data through an iteration process. When the decoder 1220 performs the iteration, it may reference the first memory 1222 included in the decoder 1220. The decoder 1220 may access only the first memory 1222 or both the first and second memories 1222 and 1224 depending on the type of data stored in the first memory 1222. The storage capacity of the first memory 1222 may be smaller than the storage capacity of the second memory 1224. The size of data stored in the first memory 1222 may be smaller than the size of data stored in the second memory 1224. The iterative decoding performed by the decoder 1220 may be the same as or similar to the decoding scheme described herein.

While the present disclosure has been particularly shown and described with reference to certain embodiments thereof, it will be understood by those of ordinary skill in the art that various changes in form and detail may be made therein without departing from the spirit and scope of the present disclosure as defined by the following claims. The certain embodiments should be considered in a descriptive sense only and not for purposes of limitation.

What is claimed is:

1. A storage device comprising:
a first memory;
a second memory; and
a processor configured to:
perform a flag encoding operation on first data generated by the processor during an iterative decoding operation to generate first flag data representing the first data when the flag encoding operation on the first data is successful;
perform the flag encoding operation on second data generated by the processor during the iterative decoding operation and generate second flag data having a predetermined value when the flag encoding operation on the second data is unsuccessful;
store the second data in the first memory based on the second flag data having the predetermined value; and
store the first flag data and the second flag data in the second memory,
wherein the first data is larger than the first flag data, and the second data is larger than the second flag data.

2. The storage device of claim 1, wherein the second memory has a smaller storage capacity than the first memory.

3. The storage device of claim 1, wherein the processor is further configured to access the second memory to store the second flag data before accessing the first memory to store the second data.

4. The storage device of claim 1, further comprising:
a non-volatile memory configured to store data; and
a memory controller configured to receive a first command from an external device, and to read the data stored in the non-volatile memory based on the first command,
wherein the processor is further configured to error correction decode (ECC) the data based on the first command.

5. The storage device of claim 1, wherein the first flag data comprises a plurality of first bits representing the first data.

6. The storage device of claim 5, wherein the second flag data comprises a plurality of second bits indicating the flag encoding operation was unsuccessful.

7. The storage device of claim 1, wherein the first flag data indicates a location of each bit of a plurality of first bits of the first data that has a value of 1.

8. The storage device claim 7, wherein a single bit of the plurality of first bits of the first data has the value of 1, and the first flag data comprises a binary representation of the location of the single bit within the plurality of first bits.

9. The storage device of claim 8, wherein the binary representation of the location of the single bit indicates a number of bits from a rightmost bit of the plurality of first bits of the first data.

10. The storage device of claim 7, wherein the first flag data comprises a run-length code indicating a number of consecutive bits in the first data that has the value of 1.

11. The storage device of claim 7, wherein the first flag data comprises a run-length code indicating a first number of consecutive bits in the first data that have the value of 1 and a second number of consecutive bits in the first data that have a value of 0.

12. A storage device comprising:
a first memory;
a second memory; and
a processor configured to:
perform a flag encoding operation on data generated by the processor during an iterative decoding operation to generate flag data representing the data;
when the flag encoding operation is successful, store the flag data in the second memory; and
when the flag encoding operation is unsuccessful, store the data in the first memory and the flag data in the second memory.

13. The storage device of claim 12, wherein the processor is further configured to, when the flag encoding operation is successful, store the flag data in the second memory without storing the data in the first memory.

14. The storage device of claim 12, wherein the processor is further configured to, when the flag encoding operation is unsuccessful, access the second memory to store the flag data before accessing the first memory to store the data.

15. The storage device of claim 12, wherein the flag data comprises a plurality of bits representing the data, when the flag encoding operation is successful.

16. The storage device of claim 15, wherein, when the flag encoding operation is unsuccessful, the flag data comprises a plurality of second bits indicating the flag encoding operation was unsuccessful.

17. The storage device of claim 12, wherein, when the flag encoding operation is successful, the flag data indicates a location of each bit of a plurality of bits of the data that has a value of 1.

18. The storage device claim 17, wherein, when the flag encoding operation is successful, a single bit of the plurality of bits of the data has the value of 1, and the flag data comprises a binary representation of the location of the single bit within the plurality of bits.

19. The storage device of claim 18, wherein the binary representation of the location of the single bit indicates a number of bits from a rightmost bit of the plurality of bits of the data.

20. A method of operating a storage device that includes a first memory, a second memory and a processor, the method comprising:

performing a flag encoding operation on first data generated by the processor during an iterative decoding operation to generate first flag data representing the first data when the flag encoding operation on the first data is successful;

storing the first flag data in the first second memory;

performing the flag encoding operation on second data generated by the processor during the iterative decoding operation and generating second flag data having a predetermined value when the flag encoding operation on the second data is unsuccessful;

storing the second flag data in the second memory; and storing the second data in the first memory based on the second flag data having the predetermined value.

* * * * *